United States Patent [19]

Schneider

[11] 4,107,474
[45] Aug. 15, 1978

[54] BIPOLAR TRANSISTOR SWITCHING NETWORK CROSSPOINT

[75] Inventor: Herbert Anton Schneider, Boulder, Colo.

[73] Assignee: Bell Telephone Laboratories, Incorporated, Murray Hill, N.J.

[21] Appl. No.: 801,467

[22] Filed: May 31, 1977

[51] Int. Cl.² .............................................. H04Q 3/52
[52] U.S. Cl. ............................. 179/18 GF; 340/166 R
[58] Field of Search ............... 307/255, 200 A, 200 B, 307/236, 242, 297, 313; 340/166 R, 173 R; 179/18 GF, 18 FA

[56] References Cited

U.S. PATENT DOCUMENTS

| | | | |
|---|---|---|---|
| 3,550,088 | 12/1970 | Jones | 340/166 R |
| 3,789,151 | 1/1974 | Richards | 179/18 GF |
| 3,883,696 | 5/1975 | Richards | 179/18 GF |
| 3,931,475 | 1/1976 | Bachle | 179/18 GF |
| 3,986,174 | 10/1976 | Wisseman et al. | 307/313 |
| 3,993,978 | 11/1976 | Hollis | 340/166 R |

*Primary Examiner*—Thomas A. Robinson
*Attorney, Agent, or Firm*—James M. Graziano

[57] ABSTRACT

A semiconductor switching network is disclosed in which complementary bipolar transistors are employed as "floating" crosspoints. Each crosspoint consists of a pair of complementary bipolar transistors with each transistor being connected in series with one of the leads of the communication pair. Each one of the complementary bipolar transistors is, in turn, surrounded by a "protective control shell" of diodes and transistors which provides the crosspoint with overvoltage and reverse voltage protection and secures crosspoint turn-off. Additionally, the protective control shell contains a self-bias arrangement to eliminate the need for external power supplies to operate the crosspoint as well as an optoisolator control circuit to eliminate direct connections to external control circuits. Thus, the disclosed "protective control shell" converts the complementary bipolar transistors into a "floating" crosspoint - powered solely from the communication leads with no direct connection to any external power supply or control circuit, which crosspoint is insensitive to both the polarity and the magnitude of the applied voltage and current.

15 Claims, 6 Drawing Figures

BIPOLAR TRANSISTOR SWITCHING NETWORK CROSSPOINT

FIELD OF THE INVENTION

This invention relates to semiconductor switching networks and in particular to a bipolar complementary transistor crosspoint arrangement which provides a completely "floating" crosspoint - powered solely from the communication leads with no direct connection to any external power supply or control circuit, which crosspoint is insensitive to both the magnitude and the polarity of the applied voltage and current.

DESCRIPTION OF THE PRIOR ART

Numerous semiconductor switching network crosspoint arrangements are found in business communication systems. The crosspoint elements employed by these prior art semiconductor switching networks are either PNPN devices, bipolar transistors, diodes, SCR's, or field effect transistors. Each of these named devices has serious disadvantages when used as a crosspoint element, but of the group, saturated bipolar transistor crosspoints come closest to having the ideal crosspoint characteristics. This is because saturated bipolar transistor crosspoints provide low crosspoint on-resistance, can carry large currents, and can also withstand high line voltages. To achieve this capability, a relatively large drive current must be supplied to each bipolar transistor to maintain the transistors in the saturated mode. Prior art bipolar transistor crosspoint arrangements use two or more power supplies to generate this required drive current. However, the magnitude of the crosspoint drive current causes excessive noise coupling to the communication leads and line unbalance due to the power supplies while also consuming large amounts of power. In addition to this drive current disadvantage, bipolar transistors have an internal sensitivity problem. Ideally, both the contact and the controls of a crosspoint should be insensitive to the polarity and the magnitude of the voltages and currents applied to any of the crosspoint nodes. However, bipolar transistor nodes are notoriously and purposely interdependent and, therefore, to obtain disjunctivity in bipolar transistor crosspoints requires the use of supportive elements.

The need for supportive elements is further illustrated by examining a prior art bipolar transistor crosspoint arrangement disclosed in the G. J. Jones patent, U.S. Pat. No. 3,550,088 issued Dec. 22, 1970. The Jones patent discloses a semiconductor crosspoint consisting of a pair of bipolar complementary transistors connected in series with the communication leads and operating in the saturated mode. The bases of the Jones crosspoint transistors are connected together through a Field Effect Transistor (FET) control circuit so that the Jones crosspoint is powered directly from the communication leads and is capable of carrying loop current.

However, the bipolar transistors employed as the crosspoint elements in the Jones patent are provided with no protective circuitry. The crosspoint is strictly unilateral in operation and a direct connection is maintained between the crosspoint itself and the control logic circuitry. Thus, prior art crosspoints contain no provisions for correcting the aforementioned internal sensitivity problem associated with bipolar transistor crosspoints. None of the prior art crosspoint arrangements address all of the following problems: crosspoint overvoltage protection, supply voltage reversals, secure crosspoint turn-off, interaction between the crosspoints and control logic circuitry, and the parallel operation of crosspoints in a switching network environment. Therefore, since these prior art bipolar transistor crosspoints lack the supportive elements necessary to obtain the required disjunctivity, they cannot be employed as viable semiconductor crosspoints.

In view of the foregoing, an object of this invention is to provide a bipolar transistor crosspoint arrangement that is powered solely from the communication leads.

It is a further objective of this invention to provide a bipolar transistor crosspoint arrangement that provides total isolation between the crosspoint element and its associated control circuit.

It is a further objective of this invention to provide a bipolar transistor crosspoint arrangement that supplies the required disjunctivity to make the crosspoint insensitive to both the polarity and the magnitude of the applied voltage and current.

It is a further objective of this invention to provide a bipolar transistor crosspoint arrangement that provides bilateral transmission on the communication leads.

It is a further objective of this invention to provide a bipolar transistor crosspoint arrangement that can be completely fabricated using integrated circuit techniques.

SUMMARY OF THE INVENTION

In accordance with my invention, I provide the necessary supportive elements to convert a basic bipolar complementary transistor pair into a viable semiconductor switching network crosspoint. This is accomplished by providing a "protective control shell" around each transistor of the basic bipolar complementary transistor pair to generate a "floating" crosspoint.

The protective control shell employs transistors, optoisolators and diodes to encircle each transistor of the basic bipolar complementary transistor pair comprising the crosspoint element. These additional devices function both to provide overvoltage protection and to secure the crosspoint turn-off without adversely affecting the switching characteristics of the bipolar transistor which make it desirable as a crosspoint element. The protective control shell protects the bipolar complementary transistors by acting as a buffer between the crosspoint bipolar transistors and the communication pair. This configuration enables the protective control shell to absorb or reject any overvoltages or reverse voltages appearing on the communication pair while the bipolar transistors, acting as the crosspoint, encounter only forward voltages within the proper operating range. The use of this protective control shell therefore yields a crosspoint element insensitive to both the polarity and the magnitude of the applied voltage and current. Additionally, the protective control shell circuitry completely eliminates the external power supply dependency of bipolar transistor crosspoints by providing a self-bias arrangement wherein crosspoints are powered solely from the communication line itself. Optoisolator control circuitry is also provided to achieve total isolation between the crosspoint element and the external control circuit.

Thus, in the disclosed arrangement, a completely floating crosspoint is obtained by employing a protective control shell as a buffer between the crosspoint transistors and the communication leads and the crosspoint control circuitry. The protective control shell supplies the disjunctivity required to produce a viable bilateral semiconductor switching network crosspoint arrangement.

Accordingly, it is a feature of the invention to provide, in semiconductor switching networks, facilities for making the crosspoint independent of both the polarity and the magnitude of the applied voltage and current.

A further feature of the invention is the provision of facilities for powering the crosspoint solely from the communication leads.

A further feature of the invention is the provision of facilities for completely isolating the crosspoint from the control circuitry.

A further feature of the invention is the provision of facilities for enabling the crosspoint to be used as a unidirectional crosspoint element in a bilateral switching network.

BRIEF DESCRIPTION OF THE DRAWING

The operation of the present invention will be more fully apparent from the following description of the drawing, in which.

GENERAL DESCRIPTION - FIGS. 1 AND 2

Figure 1:
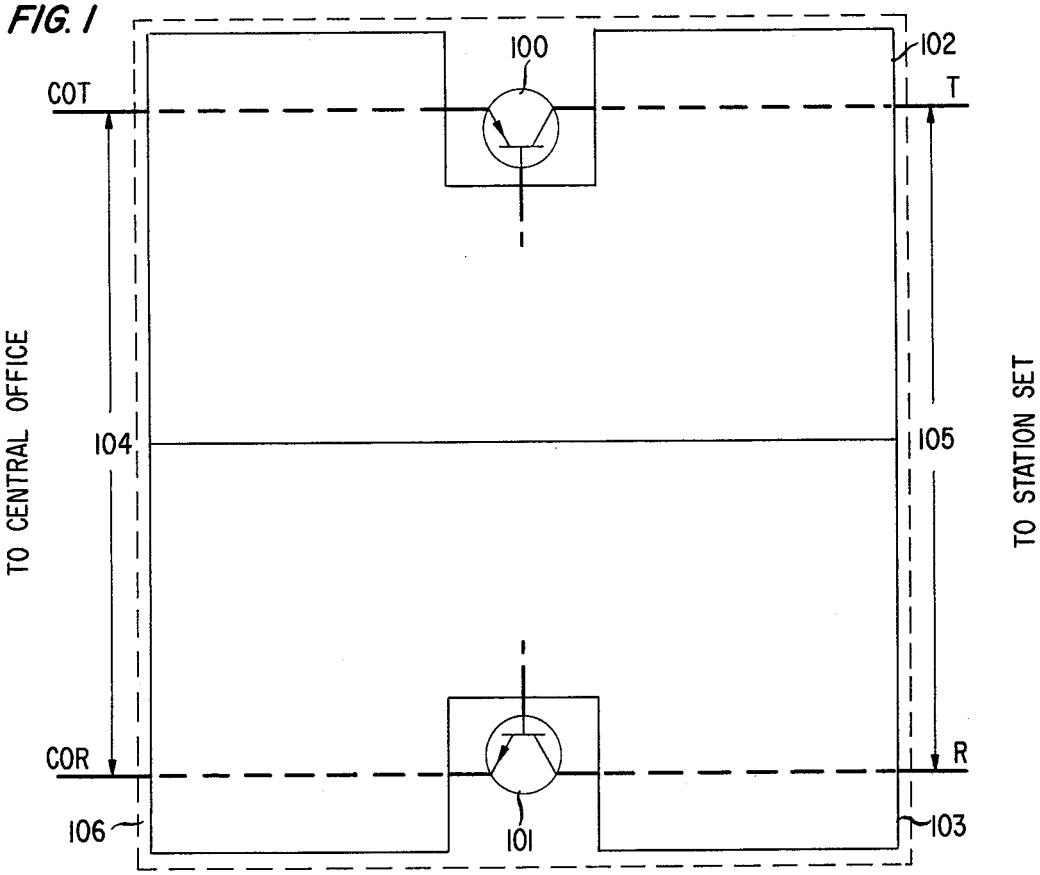
FIG. 1 illustrates the invention in block diagram form.

FIG. 1 shows the broader system aspects of my invention as embodied in a bipolar complementary transistor switching network crosspoint arrangement. In the disclosed embodiment, a complete switching network is not shown. Instead, for simplicity's sake, a single crosspoint 106 inserted between a central office line 104 and a station set (not shown) is disclosed to clearly show the features and advantages of my invention.

Central office line 104, consisting of tip and ring conductors COT and COR respectively, are connected to the left side of the disclosed switching network crosspoint 106. Communication pair 105, consisting of tip and ring conductors T and R respectively, connect the right side of the disclosed switching network crosspoint 106 with a station set (not shown). The disclosed switching network crosspoint itself consists of a pair of bipolar complementary transistors 100 and 101 each surrounded by their respective "protective control shells" 102 and 103. These protective control shells function to convert the pair of bipolar complementary transistors 100 and 101 into a "floating" crosspoint pair. This floating crosspoint provides a unidirectional communication path between the central office line and the station set.

When DC supervisory voltage is placed on central office line 104, and the crosspoint is turned on, current will flow through the crosspoint in a unidirectional fashion. If the central office line has a positive voltage on lead COT and a negative voltage on lead COR, DC current will flow from the central office line on lead COT through crosspoint transistor 100 to lead T and thence to the station set. From the station set, current will return on lead R through crosspoint transistor 101 and thence to the central office line on lead COR. Thus, the crosspoint disclosed in FIG. 1 takes advantage of the unidirectional nature of the loop current and provides a unidirectional current path through the bipolar complementary transistors from the central office line to the station set.

Figure 2:
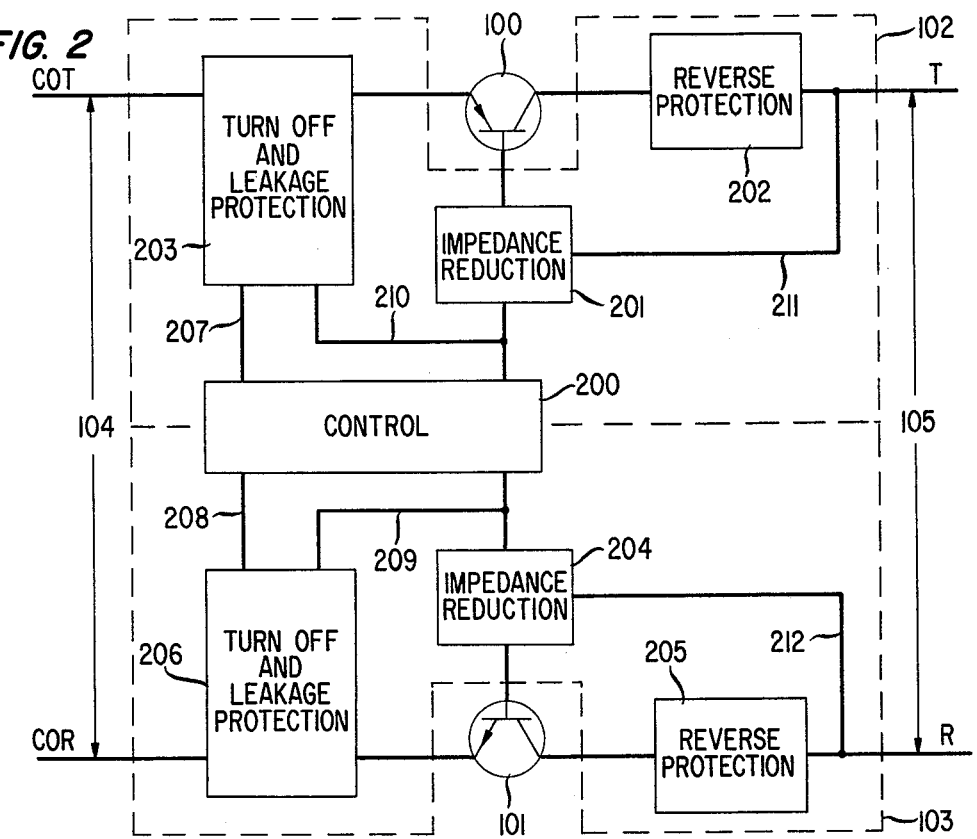
FIG. 2 shows one embodiment of the invention in block diagram form.

FIG. 2 discloses further details of protective control shells 102 and 103 in block diagram form. Each protective control shell consists of various protective devices and control devices to act as a buffer and to convert the associated bipolar transistor into a voltage and current insensitive contact of the floating crosspoint. In particular, bipolar transistor 100 is surrounded by protective control shell 102 which consists of elements 200, 201, 202 and 203. Element 200 comprises a control circuit to regulate the on/off status of the crosspoint. Element 200 is itself controlled by a crosspoint control signal which is supplied by a crosspoint control circuit (not shown). Elements 201, 202 and 203 comprise the protective shell which surrounds bipolar transistor 100. Element 202 comprises a reverse protection circuit to protect crosspoint transistor 100 from reverse voltages appearing across leads COT and T. Element 201 comprises an impedance and current-reduction circuit to counteract the effects of reverse protection circuit 202 on the forward impedance characteristic of crosspoint transistor 100. Element 203 comprises both secure turn-off and leakage protection circuitry. The circuitry of element 203 reduces the collector current leakage to assure that the crosspoint is turned off while also providing reverse voltage protection for the base-emitter junction. Elements 200 and 204, 205 and 206 of protective control shell 103 function in a similar fashion with crosspoint transistor 101 and its associated leads, COR and R.

Thus, the protective circuitry of protective control shell 102 isolates the crosspoint transistor 100 from any overvoltage appearing on the communication pairs 104 and 105. Crosspoint transistor 100 encounters only the normal forward bias and communication signals, while the crosspoint as a whole is able to withstand both battery reversals and overvoltages without coupling between the transistor nodes or the generation of significant leakage currents. Additionally, control circuit 200 operates the crosspoint without external power supplies by connecting the base of crosspoint transistor 100 to the base of crosspoint transistor 101 via the impedance reduction circuits 201 and 204. This connection causes a bias current to flow from lead COT through crosspoint transistor 100 through control circuit 200 to crosspoint transistor 101 and thence to lead COR. Thus, the crosspoint is operated from a bias current obtained solely from the communication leads without employing any external power supplies. This provides balanced operation of the crosspoint since the same bias current is used to operate both crosspoint transistors, insuring that the operating point of the two transistors is identical. Thus, the protective control shells 102 and 103 act as buffers between the sensitive crosspoint transistors 100 and 101 and the communication leads 104, 105 to create a "rugged" crosspoint, which crosspoint is insensitive to both the magnitude and the polarity of the applied voltage and current while also being powered solely from the communication leads. The disclosed complementary bipolar transistor crosspoint approaches the ideal crosspoint characteristics: exhibits low crosspoint onresistance, is capable of carrying large currents, can withstand high line voltages, maintains total isolation between the crosspoint and its control circuitry, requires no external source of power, and exhibits a high level of disjunctivity between input, output and control nodes in the off-state.

DETAILED DESCRIPTION - FIG. 3

Figure 3:
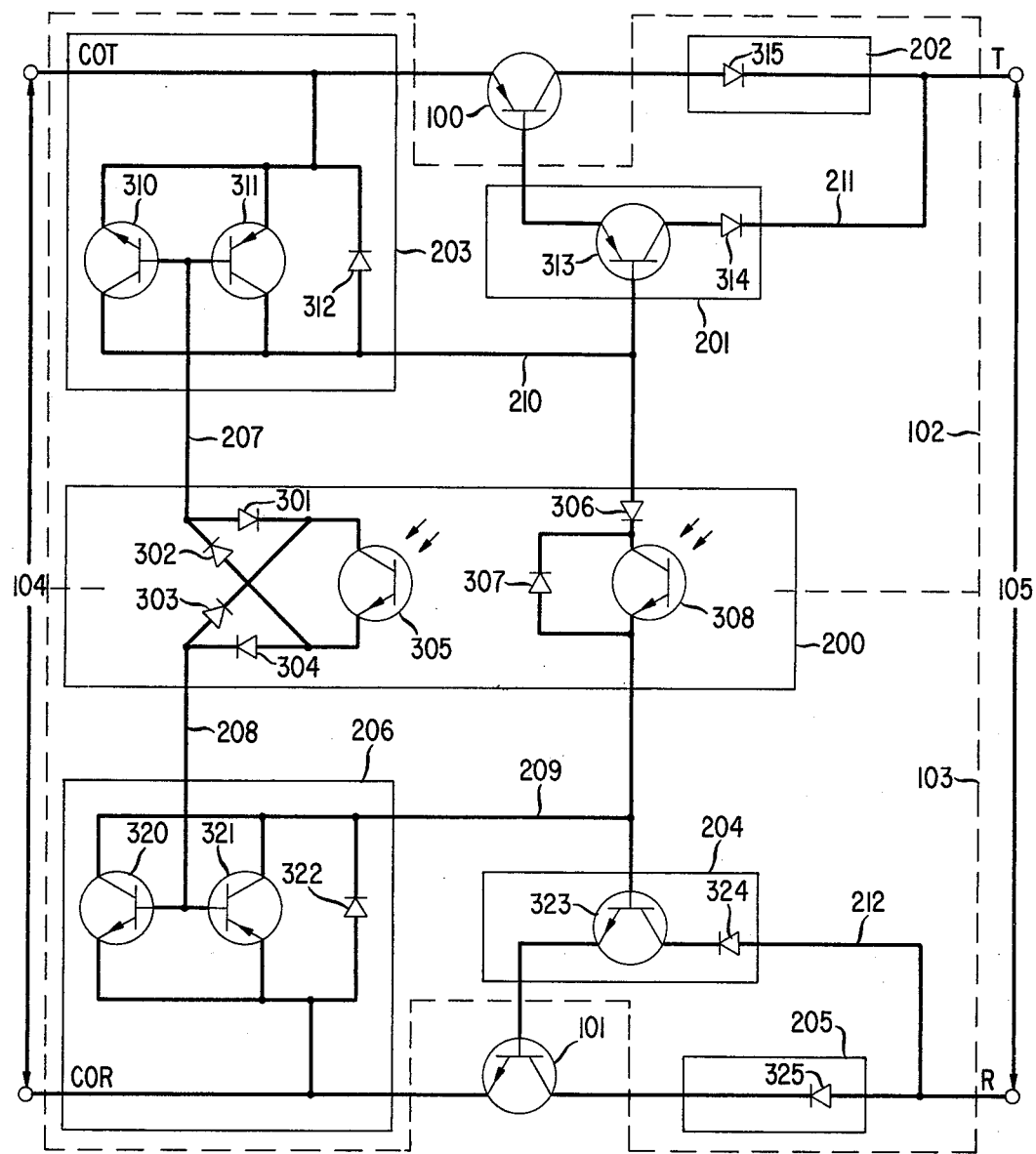
FIG. 3 shows a preferred embodiment of the invention.

Drawing FIG. 3 illustrates how the various elements of my inventive embodiment cooperate to provide a unidirectional floating bipolar complementary transistor crosspoint. The various protection and control elements are arranged with respect to each other in FIG. 3 in a manner analogous to that of FIG. 2.

Assume that the same call conditions exist for the bipolar complementary transistor crosspoint of FIG. 3 as existed for the crosspoint of FIG. 2. That is, central office line 104 has a DC bias voltage applied to it with lead COT having a positive voltage and lead COR having a negative voltage. Additionally, a telephone station set (not shown) is connected to communication pair 105, between leads T and R.

CONTROL CIRCUIT 200

Control circuit 200 contains two phototransistors 305 and 308 which are operated by a crosspoint control signal supplied by a crosspoint control circuit (not shown) containing light emitting diodes. The operation of such a control circuit will be explained hereinafter with reference to FIG. 4. The crosspoint control circuit, by activating its light emitting diodes, maintains phototransistor 308 on and phototransistor 305 off to activate the crosspoint while the opposite situation operates to switch off and keep off the crosspoint. Thus, with DC bias applied to communication pair 104, complementary bipolar transistors 100 and 101 carry the crosspoint current only when the crosspoint control circuit light emitting diodes turn off phototransistor 305 and turn on phototransistor 308. To further illustrate this control arrangement, assume that the crosspoint is switched into the off state.

CROSSPOINT - OFF STATE

To turn the crosspoint off, the crosspoint control circuit switches off phototransistor 308 and switches on phototransistor 305. Phototransistor 308 off prevents bias current from flowing between the bases of crosspoint transistors 100 and 101, causing them to turn off. However, the collector leakage current ($\beta I_{CO}$) of each crosspoint transistor may not be negligible with the emitter-base junction being unprotected, and the bases of transistors 313 and 323 virtually floating. Therefore, protective control shells 102 and 103 provide turn-off and leakage protection circuits 203 and 206 to protect against these effects.

TURN-OFF AND LEAKAGE PROTECTION CIRCUITS 203, 206

Diodes 312 and 322 of protection circuits 203 and 206 respectively, provide the emitter-base junctions of both crosspoint transistors 100 and 101 and the transistors of impedance reduction circuits 201 and 204 with reverse bias protection by presenting a low impedance to reverse voltages appearing across these emitter-base junctions.

Protection transistors 310, 311, 320 and 321 provide secure turn-off for crosspoint transistors 100 and 101 respectively. These protection transistors, when activated, provide a virtual short circuit across the emitter-base junctions of crosspoint transistors 100 and 101 thus minimizing collector current leakage effects. These secure turn-off transistors are activated by phototransistor 305 turning on, thereby biasing these transistors in a manner analogous to the bias arrangement of the crosspoint transistors themselves. To wit, current flows from lead COT, through the emitter-base junction of transistor 311 of protection circuit 203, thence through diode 301, phototransistor 305, diode 304 of control circuit 200, and finally through the base-emitter junction of transistor 320 of protection circuit 206 to lead COR. This bias current saturates protection transistors 311 and 320 thereby shorting out the base-emitter junctions of crosspoint transistors 100 and 101 and impedance reduction transistors 313 and 323. Diodes 301 to 304 of control circuit 200 provide a bridge arrangement to supply a unidirectional current flow to phototransistor 305 irrespective of the polarity of the voltage appearing on communication pair 104. Thus, if a reverse voltage appears on communication pair 104, protection transistors 321 and 310 would be provided with bias current, which current would flow through diode 303, phototransistor 305 and diode 302. This current would saturate protection transistors 310 and 321 thereby shorting out the base-emitter junctions of crosspoint transistors 100 and 101, protecting them from the reverse voltage appearing on communication pair 104.

Thus, the base-emitter junctions of crosspoint transistors 100 and 101 are continually protected from reverse voltages by diodes 312 and 322 of protection circuits 203 and 206. Additionally, protection circuits 203 and 206, under control of phototransistor 305, provide a short circuit across the base-emitter junctions of crosspoint transistors 100 and 101 to prevent the appearance of any off-state collector leakage current. The base-emitter short circuits coupled with the removal of bias current by phototransistor 308 guarantees that the crosspoint presents an open circuit between communications pairs 104 and 105.

CROSSPOINT- ON STATE

To switch the crosspoint on, the aforementioned base-emitter short circuits must be removed and crosspoint transistors 100 and 101 must be supplied with a bias current. This is accomplished by the crosspoint control circuit supplying a crosspoint control signal to turn on phototransistor 308 and turn off phototransistor 305 of control circuit 200.

Phototransistor 305 off removes the bias current from protection transistors 310 and 321/311 and 320. The elimination of this bias current causes these protection transistors to turn off, thereby removing the short circuits from the base-emitter junctions of crosspoint transistors 100 and 101.

Phototransistor 308 on establishes a DC path between the base of crosspoint transistor 100 and the base of crosspoint transistor 101. Since the crosspoint transistors 100 and 101 are complementary bipolar transistors with a DC bias voltage applied to their emitter junctions, DC bias current will flow from lead COT through the emitter-base junction of crosspoint transistor 100, through the emitter-base junction of transistor 313, through diode 306 and activated phototransistor 308, thence through the base-emitter junction of transistor 323, and the base-emitter junction of crosspoint transistor 101 to lead COR. Thus, the exact same bias current flows through both crosspoint transistors 100 and 101, biasing both transistors identically. The provision of identical bias currents to both crosspoint transistors insures that the crosspoint operates in a balanced fashion. Additionally, this bias current is drawn solely from the communication leads rather than from external power supplies, thus assuring isolation of the crosspoint from other crosspoints in the switching network.

Diodes 306 and 307 in control circuit 200 function to protect phototransistor 308 from the application of a reverse voltage. Diode 306 assures a unidirectional current flow through the phototransistor and also absorbs any reverse bias voltages appearing across phototransistor 308 on leads 209 and 210. Diode 307 is connected in parallel with phototransistor 308 and provides a low impedance in the reverse direction across phototransistor 308 so that any reverse bias appearing across leads 209 and 210 will not be seen by phototransistor 308 but will be fully absorbed by diode 306.

REVERSE PROTECTION CIRCUITS 202, 205

Switching the aforementioned DC bias current through crosspoint transistors 100 and 101 turns on these crosspoint transistors thereby providing a unidirectional emitter-collector current path between leads COT and T and also between leads R and COR. Protective control shells 102 and 103 provide reverse protection circuits 202 and 205 in series with crosspoint transistors 100 and 101, which circuits comprise diodes 315 and 325 respectively. Diodes 315 and 325 function to absorb any reverse bias applied to the collector-emitter junctions of crosspoint transistors 100 and 101 respectively.

IMPEDANCE REDUCTION CIRCUITS 201, 204

However, the use of reverse protection circuits 202 and 205 in protective control shells 102 and 103 add additional series impedance to the communication path and thus impedance reduction circuits 201 and 204 are employed to counteract this effect. Impedance reduction circuits 201 and 204 consist of transistor and diode combinations 313 and 314, 323 and 324 respectively, which are connected between the base terminal of the crosspoint transistor and the communication pair 105. These impedance reduction circuits are connected in parallel with the crosspoint transistor and the reverse protection circuit and function to reduce the forward impedance of the crosspoint.

Thus, when the crosspoint is in the off-state, the protective control shells prevent the generation of leakage currents and protect bipolar crosspoint transistors 100 and 101 from any excessive voltages. The protective control shells also function to protect crosspoint transistors 100 and 101 from excessive voltages when the crosspoint is in the on-state in addition to providing the requisite bias current to crosspoint transistors 100 and 101. The entire crosspoint is powered solely from the communications leads and there is no direct connection to any external power or control circuits. The crosspoint control signals are light signals, thereby insuring a unidirectional signal path with total isolation. Thus, the protective control shells create a floating crosspoint - insensitive to the magnitude and polarity of the applied voltage and current, which crosspoint provides the communication path with a low on-state impedance and a high off-state impedance.

Figure 4:
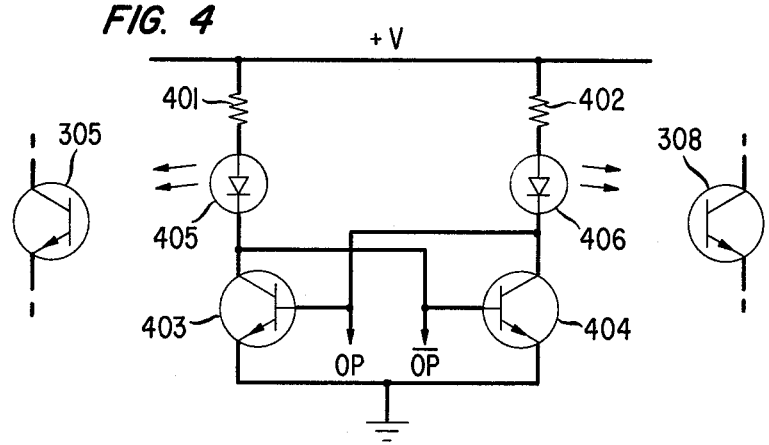
FIG. 4 shows a typical crosspoint control arrangement

CROSSPOINT CONTROL CIRCUIT - FIG. 4 p

FIG. 4 illustrates one embodiment of a crosspoint control circuit which can be used to control the on/off states of the bipolar complementary transistor crosspoint of FIG. 3. The crosspoint control circuit of FIG. 4 comprises a standard flip-flop arrangement wherein transistors 403 and 404 assume one of two complementary stable states depending on the pulse signals appearing on leads OP and OP. If lead OP carries a high signal, transistor 403 would be on and transistor 404 would be off, since complementary lead OP would therefore carry a low signal. When the control signals are removed from leads OP and OP, the transistors remain in their respective on/off states due to the signals present on the feedback paths from the collector of each transistor to the base of the other transistor. The on-off states of transistors 403 and 404 are reflected in the on/off states of their associated light emitting diodes, 405 and 406 respectively. In the present example, transistor 403 is on, therefore current flows from voltage +V through resistor 401, light emitting diode 405, and through the collector-emitter junction of transistor 403 to voltage ground. Thus, light emitting diode 405 assumes the same on/off state as transistor 403. Similarly, light emitting diode 406 follows the on/off state of transistor 404.

Control of the crosspoint is achieved by coupling the light output (the crosspoint control signals) of light emitting diodes 405 and 406 with the bases of crosspoint phototransistors 305 and 308 respectively. In the present example, light emitting diode 405 is off and its associated phototransistor 305 is likewise off, thereby switching off turn off and leakage protection circuits 203 and 206. Protection circuits 203 and 206 off removes the short circuit applied across the base-emitter junctions of crosspoint transistors 100 and 101. Meanwhile, light emitting diode 406 is on, transmitting light to the base of phototransistor 308. This light impinging on the base of phototransistor 305 turns on phototransistor 308, thereby supplying the crosspoint with bias current. Therefore, the crosspoint is switched on, with DC bias voltage appearing at the emitter of both crosspoint transistors 100 and 101 as well as DC bias current flowing through the base-emitter junctions of both crosspoint transistors.

Reversing the on/off states of crosspoint control circuit transistors 403 and 404 switches the crosspoint off by turning off crosspoint phototransistor 308 and turning on crosspoint phototransistor 305. This removes the crosspoint DC bias current supplied by crosspoint phototransistor 308 and also causes crosspoint phototransistor 305 to activate protection circuits 203 and 206. Protection circuits 203 and 206 guarantee the off state of the crosspoint by applying a short circuit across the base-emitter junctions of crosspoint transistors 100 and 101.

Thus, the disclosed crosspoint control circuit controls the on/off states of its associated bipolar complementary transistor crosspoint without maintaining a direct connection between the two circuits. The light emitting diode-phototransistor combination provides a completely unidirectional signal flow, by presenting an essentially infinite impedance to signals in the reverse direction. Thus, the crosspoint control circuit is completely independent of and insensitive to the voltages and currents appearing at the crosspoint terminals. In this manner, the crosspoint is "floating" with respect to the crosspoint control circuit and its associated voltages.

BILATERAL SWITCHING NETWORK - FIG. 5

Figure 5:
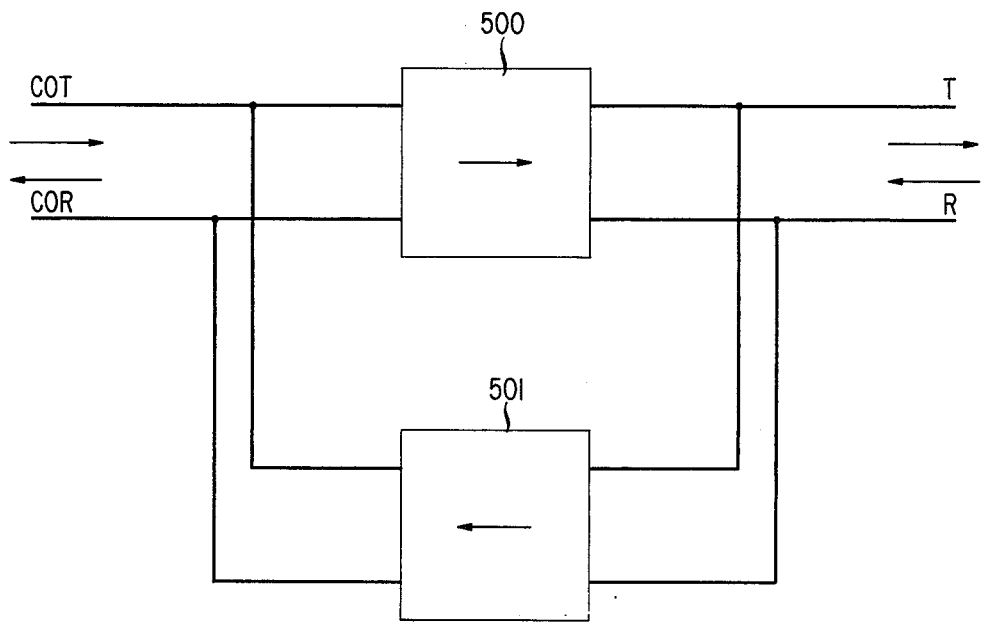
FIG. 5 shows the crosspoint configured for bilateral transmission.

FIG. 5 illustrates the crosspoint configuration for bilateral DC transmission. Elements 500 and 501 each comprise the crosspoint of FIG. 3, with bilateral transmission obtained by stacking the two crosspoints in parallel, with element 501 being connected in the reverse direction to element 500. Therefore, element 500 provides a unidirectional current path from lead COT to lead T and from lead R to lead COR while element 501 provides a unidirectional current path in the reverse direction from lead T to lead COT and from lead COR to lead R. In a similar fashion, the crosspoint control circuits associated with each crosspoint element are stacked in parallel, with one crosspoint control circuit being connected in the reverse manner of the other crosspoint control circuit. Thus, in the disclosed arrangement the crosspoints provide communication between the central office and the station irrespective of the polarity of the DC loop supervision provided.

COMMUNICATION PATH STATUS INDICATION - FIG. 6

Figure 6:
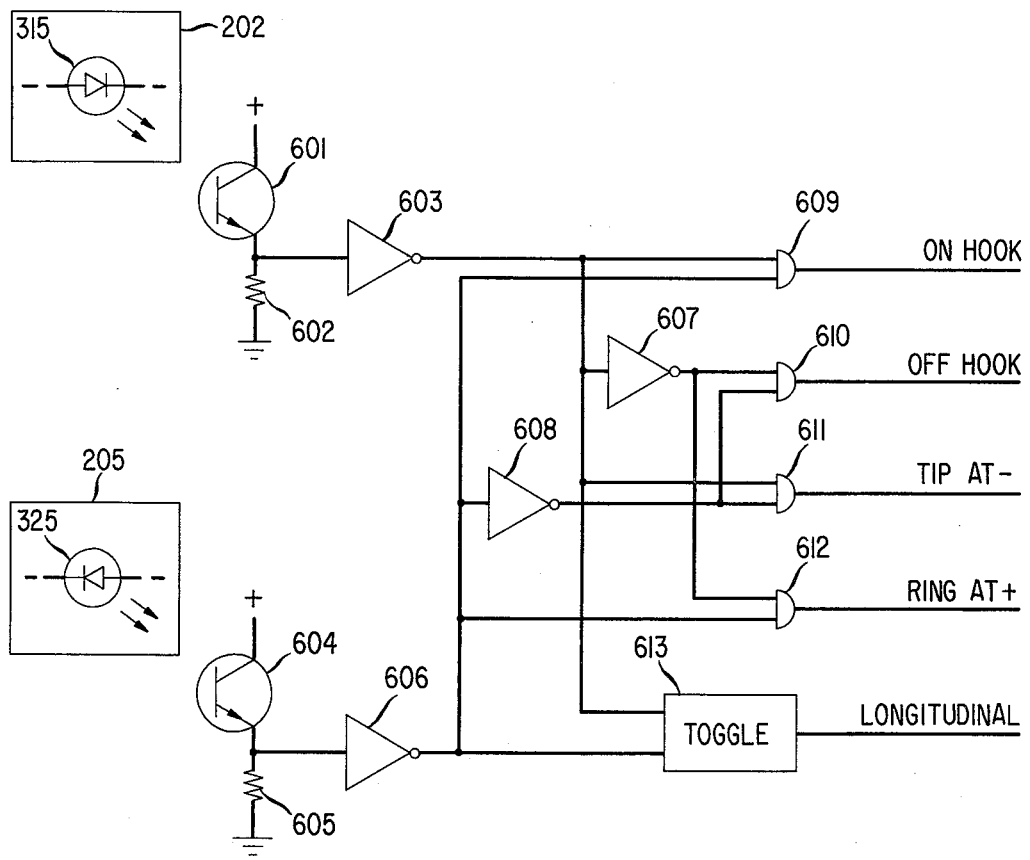
FIG. 6 shows a tip and ring status indication arrangement.

FIG. 6 illustrates one embodiment of a communication path status indication circuit that can be implemented with the disclosed bipolar complementary transistor crosspoint arrangement. Light emitting diodes 315 and 325 comprise reverse protection circuits 202 and 205 of FIG. 3 which are connected in series with crosspoint transistors 100 and 101 respectively. When DC bias is applied to communication pair 104 and the crosspoint is switched on, light emitting diodes 315 and 325 indicate when communication pair 105 is carrying current.

If the station set is off-hook, current flows from lead COT to lead T, activating light emitting diode 315. Activated light emitting diode 315 generates a light output which is transmitted to the base of phototransistor 601. Light impinging on the base of phototransistor 601 turns on phototransistor 601 which in turn activates inverter 603, providing a low signal to AND gates 609, 611 and a high signal (by way of inverter 607) to gates 610, 612. Similarly, the off-hook station set permits current to flow from lead R to lead COR, activating light emitting diode 325. Activated light emitting diode 325 generates a light output which is transmitted to the base of phototransistor 604. Light impinging on the base of phototransistor 604 turns on phototransistor 604 which in turn operates inverter 606, placing a low signal on the input of gates 609, 612 and a high signal (by way of inverter 608) on the input of gates 610 and 611. Gate 610 is the only gate in the communication path status indication circuit having two inputs high. Thus, gate 610 turns on, providing a low output signal to lead "off-hook" thereby indicating the off-hook status of the associated telephone station set.

In a similar manner, on-hook status, positive voltage on the ring lead, negative voltage on the tip lead, and longitudinal voltages can be detected by light emitting diodes 315 and 325 and indicated by the appropriate combination of logic shown in FIG. 6. Thus, the elements of the protective control shell may also be used to indicate the status of the communication path without interfering with the total isolation obtained between the crosspoint and both the external power supplied and the crosspoint control circuits. Thus, the disclosed protective control shell creates a crosspoint that is completely floating. Additionally, the protective control shell provides tip and ring status indications to the communication path status indication circuit and receives crosspoint on/off control information from the associated crosspoint control circuit without maintaining any direct connection to the crosspoint control circuit, to the communication path status indication circuit, or to any external power supply. In this manner, the disclosed protective control shell enables the crosspoint to handle a wide range of voltages and currents without having any effect on the crosspoint control circuit or any signal coupling between crosspoints in the switching network.

While a specific embodiment of the invention has been disclosed, variations in procedural and structural detail, within the scope of the appended claims, are possible and are contemplated. There is no intention of limitation to what is contained in the abstract or the exact disclosure as herein presented. The above-described arrangements are only illustrative of the application of the principles of my invention. Normally, other arrangements may be devised by those skilled in the art without departing from the spirit and the scope of my invention.

What is claimed is:

1. A bipolar transistor crosspoint arrangement comprising:
    a pair of input terminals;
    a pair of output terminals;
    a PNP bipolar transistor having an emitter, a base, and a collector terminal, said PNP transistor emitter being connected to one of said pair of input terminals;
    an NPN bipolar transistor having an emitter, a base, and a collector terminal, said NPN transistor emitter being connected to the other one of said pair of input terminals;
    control means responsive to a crosspoint control signal for enabling said transistors; and
    protective shell means connected between said control means and the respective bases of said transistors, between said control means and the respective emitters of said transistors, and between each of said output terminals and the respective collectors of said transistors for protecting said transistors from any configuration of over voltages applied to said input and said output terminals of said transistor crosspoint when said transistors are in the off state and for providing a low forward impedance across said transistors when said transistors are in the on state.

2. The invention of claim 1 wherein said protective shell means connected between said control means and the respective emitters of said transistors comprises shunt means for presenting a low impedance to forward voltages appearing across the emitter-base junction of the associated transistor.

3. The invention of claim 2 wherein said shunt means comprises:
    a PNP bipolar transistor having an emitter, a base, and a collector terminal;
    an NPN bipolar transistor having an emitter, a base, and a collector terminal;
    wherein said shunt means PNP and NPN bipolar transistors are connected in parallel in a common collector configuration across said emitter-base junction of said associated transistor, the emitters of said shunt means bipolar transistors being connected to said emitter of said associated transistor, the bases of said shunt means bipolar transistors being connected to said control means; and wherein said control means are responsive to said crosspoint control signal disabling said associated transistor for enabling said shunt means PNP and NPN bipolar transistors.

4. The invention of claim 3 wherein said bipolar transistor crosspoint arrangement includes biasing means for applying a bias voltage to said pair of input terminals, the more positive potential of said bias voltage being applied to said one of said pair of input terminals; and wherein said control means comprises means responsive to said crosspoint control signal for establishing a direct connection between said bases of the respective said shunt means PNP and NPN transistors.

5. The invention of claim 4 wherein said direct connection means comprises a phototransistor connected in series between the bases of the respective said shunt means PNP and NPN transistors.

6. The invention of claim 1 wherein said protective shell means connected between each of said output terminals and the respective collectors of said transistors comprises collector reverse breakdown preventive means for presenting a high impedance to only reverse voltages appearing between each of said output terminals and said collector of the associated transistor.

7. The invention of claim 6 wherein said collector reverse breakdown preventive means comprises a first diode connected in the forward direction between said collector of said associated transistor and the associated output terminal.

8. The invention of claim 7 wherein said first diode comprises a light emitting diode for generating a light output indicative of the presence of current flowing from said collector of said associated bipolar transistor.

9. The invention of claim 1 wherein said protective shell means connected between said control means and the respective bases of said transistors includes impedance reduction means connected between said control means, said base of the associated transistor and the associated output terminal for reducing the onresistance of said associated transistor.

10. The invention of claim 9 wherein said impedance reduction means comprises:

an impedance reduction bipolar transistor having an emitter, a base, and a collector terminal, said impedance reduction transistor emitter being connected to said base of said associated transistor, said impedance reduction transistor base being connected to said control means;

a second diode connected in series in the forward direction between said impedance reduction transistor collector and said associated output terminal; and wherein said control means are responsive to said crosspoint control signal for enabling said impedance reduction transistor.

11. The invention of claim 1 wherein said bipolar transistor crosspoint arrangement includes biasing means for applying a bias voltage to said pair of input terminals, the more positive potential of said bias voltage being applied to said one of said pair of input terminals.

12. The invention of claim 11 wherein said control means comprises means responsive to said crosspoint control signal for establishing a direct connection from said base of said PNP transistor to said base of said NPN transistor.

13. The invention of claim 12 wherein said direct connection means comprises a phototransistor connected between the bases of said transistors, said phototransistor being responsive to said crosspoint control signal comprising a light signal.

14. The invention of claim 1 wherein said protective shell means connected between said control means and the respective emitters of said transistors includes emitter reverse breakdown preventive means connected between said emitter of each said transistor and said control means for presenting a low impedance to only reverse voltages appearing across the emitterbase junction of said associated transistor.

15. The invention of claim 14 wherein said emitter reverse breakdown preventive means comprises a diode connected in the reverse direction with reference to and across said emitter-base junction of said associated transistor.

* * * * *